United States Patent
Engle

(10) Patent No.: US 8,195,039 B2
(45) Date of Patent: Jun. 5, 2012

(54) DELIVERY OF IODINE GAS

(75) Inventor: George Engle, Scottsdale, AZ (US)

(73) Assignee: Advanced Integration, Inc., Tempe, AZ (US)

( * ) Notice: Subject to any disclaimer, the term of this patent is extended or adjusted under 35 U.S.C. 154(b) by 726 days.

(21) Appl. No.: 12/334,039

(22) Filed: Dec. 12, 2008

(65) Prior Publication Data

US 2009/0154908 A1    Jun. 18, 2009

Related U.S. Application Data

(60) Provisional application No. 61/013,199, filed on Dec. 12, 2007.

(51) Int. Cl.
*A01G 13/06* (2006.01)

(52) U.S. Cl. ............ 392/387; 392/386; 392/399

(58) Field of Classification Search .................. None
See application file for complete search history.

(56) References Cited

U.S. PATENT DOCUMENTS

| | | | | |
|---|---|---|---|---|
| 3,508,402 A | * | 4/1970 | Gray et al. | 376/402 |
| 3,721,100 A | | 3/1973 | Bovio | |
| 3,947,714 A | | 3/1976 | Rehder et al. | |
| 4,434,492 A | * | 2/1984 | Benard et al. | 372/59 |
| 5,112,442 A | * | 5/1992 | Goodson | 159/49 |
| 5,265,438 A | | 11/1993 | Knowles et al. | |
| 5,435,850 A | * | 7/1995 | Rasmussen | 118/726 |
| 5,639,452 A | | 6/1997 | Messier | |
| 5,649,552 A | | 7/1997 | Cho et al. | |
| 5,693,267 A | * | 12/1997 | Beshore et al. | 261/142 |
| 6,199,599 B1 | | 3/2001 | Gregg et al. | |
| 6,245,303 B1 | | 6/2001 | Bentley et al. | |
| 6,714,570 B1 | * | 3/2004 | Brown | 372/34 |
| 7,736,617 B2 | * | 6/2010 | Shoji et al. | 423/504 |
| 2005/0178329 A1 | | 8/2005 | Engle | |

OTHER PUBLICATIONS

International Preliminary Report on Patentability, PCT/US2008/086619, issued Jun. 15, 2010, 6 pages.
PCT International Search Report and Written Opinion issued Feb. 9, 2009 for PCT/US08/86619.

* cited by examiner

*Primary Examiner* — Thor Campbell
(74) *Attorney, Agent, or Firm* — Snell & Wilmer LLP

(57) ABSTRACT

A method and system for delivering iodine gas is presented. The pure iodine gas flow can be at a controlled, known flow rate, and furthermore be held at a positive pressure in relation to a process chamber. In an exemplary embodiment, pure iodine gas is transported without the use of an inert carrier gas. This is facilitated in part by maintaining the iodine gas chamber at a higher pressure than the processing chamber.
In one exemplary embodiment, an iodine vessel receives solid iodine supplied by an iodine fill source and is heated to produce pure iodine gas. In addition, a control system monitors and controls the operating conditions in the iodine vessel and maintains a positive pressure in the iodine vessel. The iodine delivery system may include a valve system configured to control the flow of iodine gas through the iodine delivery system and into a process chamber.

23 Claims, 5 Drawing Sheets

Pressure-Temperature phase diagram for $CO_2$.

DELIVERY OF IODINE GAS

RELATED APPLICATION

This application claims priority to U.S. Provisional Application No. 61/013,199, filed Dec. 12, 2007, which is hereby incorporated by reference.

FIELD OF INVENTION

The present application relates to systems and methods for delivering iodine gas in a manufacturing process. More specifically, the present application relates to systems and methods for delivering a pure iodine gas source in a substrate formation process.

BACKGROUND OF THE INVENTION

The use of lead salt materials, such as lead sulfide (PbS), lead selenide (PbSe), and lead telluride (PbTe), in photoconductive and photovoltaic applications is well known in the art. Lead salt materials have band gap energies which allow the absorption of radiation in the infrared spectrum. In photoconductive applications, the absorption of infrared radiation by the lead salt material provides a change in its conductivity. The change in the conductivity can be sensed by sensing a current flowing therethrough. In this way, the lead salt material can be used to sense incident radiation. In photovoltaic applications, the absorption of infrared radiation in the lead salt material provides a potential difference. The potential difference can be used to provide electrical power. Accordingly, lead salt materials can be used in optoelectronic devices such as infrared photodetectors, solar cells, and thermoelectric devices, among others.

It is typically desirable to sensitize the lead salt material after is it deposited onto a substrate. The sensitization process produces lead salt material that is sensitive to incident infrared (IR) radiation at higher temperatures, such as room temperature, in comparison to the typical cold temperatures used. Sensitization is usually done by exposing the lead salt material to oxygen. The sensitization can be characterized by measuring the resistivity of the lead salt material.

Iodine is naturally in a solid state that can be liquefied. One method to liquefy is to mix the solid iodine with alcohol and heat the liquefied iodine. An inert gas, such as nitrogen, is passed over the liquefied gas to transport iodine vapor to the intended location. However, use of alcohol may affect subsequent reactions and the method is difficult to control if only a certain amount of iodine gas is desired.

Another method of iodine liquefying involves heating the solid iodine to a temperature below 183° C. where the iodine is subliming at a known rate based on the temperature. An inert gas, such as nitrogen, is introduced and transports the iodine gas to the intended location. However, use of an inert gas may disrupt the partial pressure of the iodine and affect the desired results. Furthermore, the sensitization of lead salt material regions using conventional methods often leads to undesirable differences in resistivity from one lead salt material region to another.

These problems limit the usefulness of any devices formed with lead salt materials fabricated using conventional deposition systems and methods. Hence, there is a need for better systems and methods of a sensitization process for addressing these and other issues.

SUMMARY OF THE INVENTION

In accordance with various aspects of the present invention, a method and system for delivery of pure iodine gas is presented. Furthermore, the pure iodine gas flow can be at a controlled, known flow rate, and furthermore be held at a positive pressure in relation to a process chamber. In an exemplary embodiment, pure iodine gas is transported without the use of an inert carrier gas. This is facilitated in part by maintaining the iodine gas chamber at a higher pressure than the processing chamber.

In another exemplary embodiment, lead selenide materials are exposed to iodine and oxygen at the same time at elevated temperatures during a sensitization process. Pure iodine gas may be used in various processes and/or systems. For example, pure iodine gas may be used in laser systems, or for cleaning contaminants from various surfaces.

In one exemplary embodiment, an iodine vessel is configured to receive solid iodine supplied by an iodine fill source. The iodine vessel is heated and produces pure iodine gas. In addition, a control system is configured to monitor and control the operating conditions in the iodine vessel and maintain a positive pressure in the iodine vessel. In a second exemplary embodiment, the iodine delivery system includes a valve system configured to control the flow of iodine gas through the iodine delivery system and into a process chamber.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION

While exemplary embodiments are described herein in sufficient detail to enable those skilled in the art to practice the invention, it should be understood that other embodiments may be realized and that logical electrical, chemical, and mechanical changes may be made without departing from the spirit and scope of the invention. Thus, the following detailed description is presented for purposes of illustration only.

Figure 1:
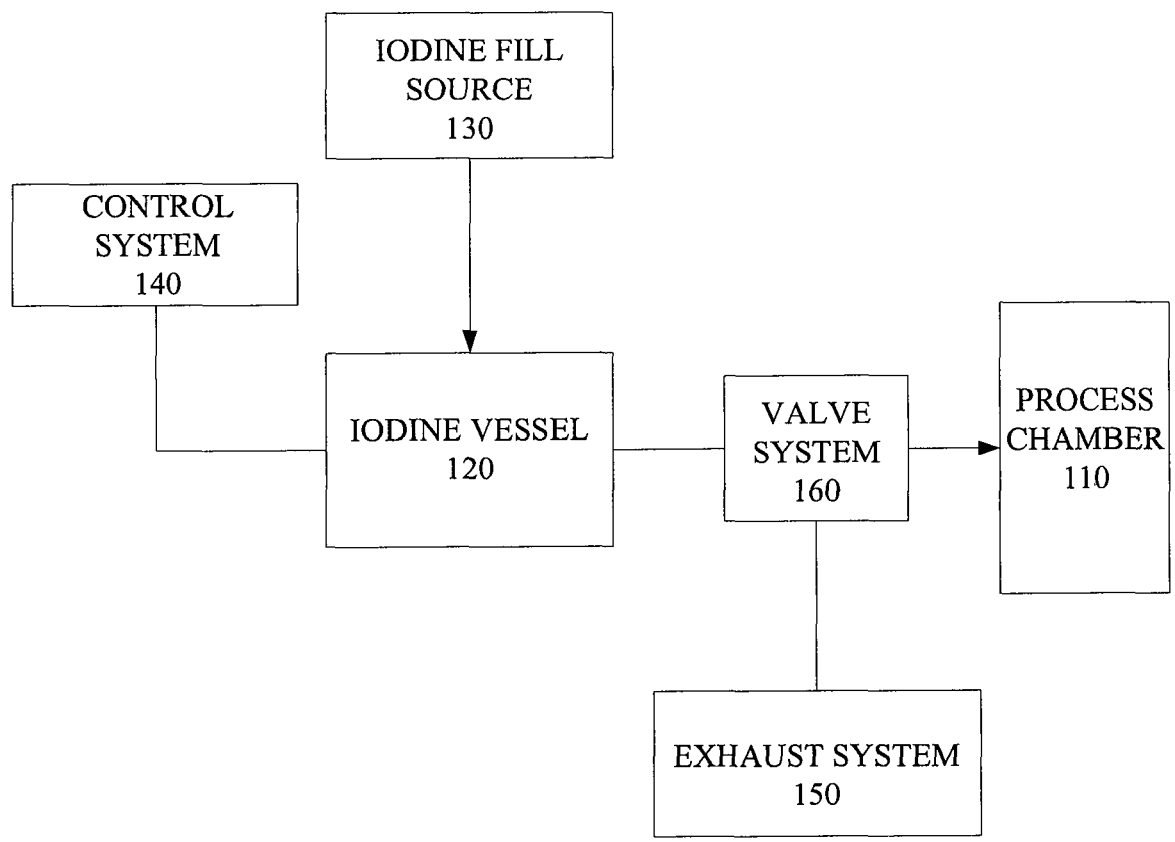
FIG. 1 illustrates an example of an iodine delivery system.

In accordance with an exemplary embodiment of the present invention and with reference to FIG. 1, an iodine delivery system 100 comprises an iodine vessel 120, a valve system 160 and a control system 140. In another exemplary embodiment, iodine delivery system 100 may further comprise an iodine fill source 130 and an exhaust system 150. Furthermore, the exemplary iodine delivery system 100 may further comprise a process chamber 110. The iodine delivery system 100 is configured to heat solid iodine until it becomes a pure iodine gas. Then the pure iodine gas is transported to process chamber 110 to facilitate various substrate manufacturing operations, such as a sensitization process. In an exemplary embodiment, pure iodine gas is 100% iodine gas or approximately 100% iodine gas. In another exemplary embodiment, pure iodine gas is 90% or more iodine gas.

In an exemplary embodiment, iodine vessel 120 is made of material that is resistant to iodine. For example, iodine vessel 120 may be quartz, a superalloy (e.g., Hastelloy), Titanium, ceramic, or other suitable material that is compatible with iodine. A quartz iodine vessel 120 is preferred because quartz is more resistant than metal to deterioration in an anhydrous iodine environment. In an exemplary embodiment, iodine vessel 120 may have thicker walls and/or strengthening ribs in order to increase the durability and positive pressure capabilities. Furthermore, in an exemplary embodiment, iodine vessel 120 is designed to withstand a positive pressure. In one embodiment, the positive pressure is up to 6 PSIG. In another embodiment, the positive pressure is up to 10 PSIG. In yet another embodiment, the positive pressure is up to 25 PSIG or more.

Iodine vessel 120 is heated in order to change solid iodine into a gas. In one exemplary embodiment and with reference to FIG. 2, heating tape 240 is used to encase or partially encase and facilitate heating of iodine vessel 120. In addition, iodine vessel could be heated with a gas flame, infrared heating, heating elements, or other suitable heating methods. In an exemplary embodiment, iodine vessel 120 is capable of being heated up to at least 230° C. In one embodiment, the temperature of iodine vessel 120 is maintained at a temperature in the range of 183° C. to 230° C., and a corresponding vessel pressure of 2 to 10 PSIG can be achieved. In another embodiment, the temperature of iodine vessel 120 is maintained at a temperature in the range of 100° C. to 300° C. It should be noted that both the temperature and pressure of iodine vessel 120 can exceed these levels in various alternative embodiments.

Figure 2:
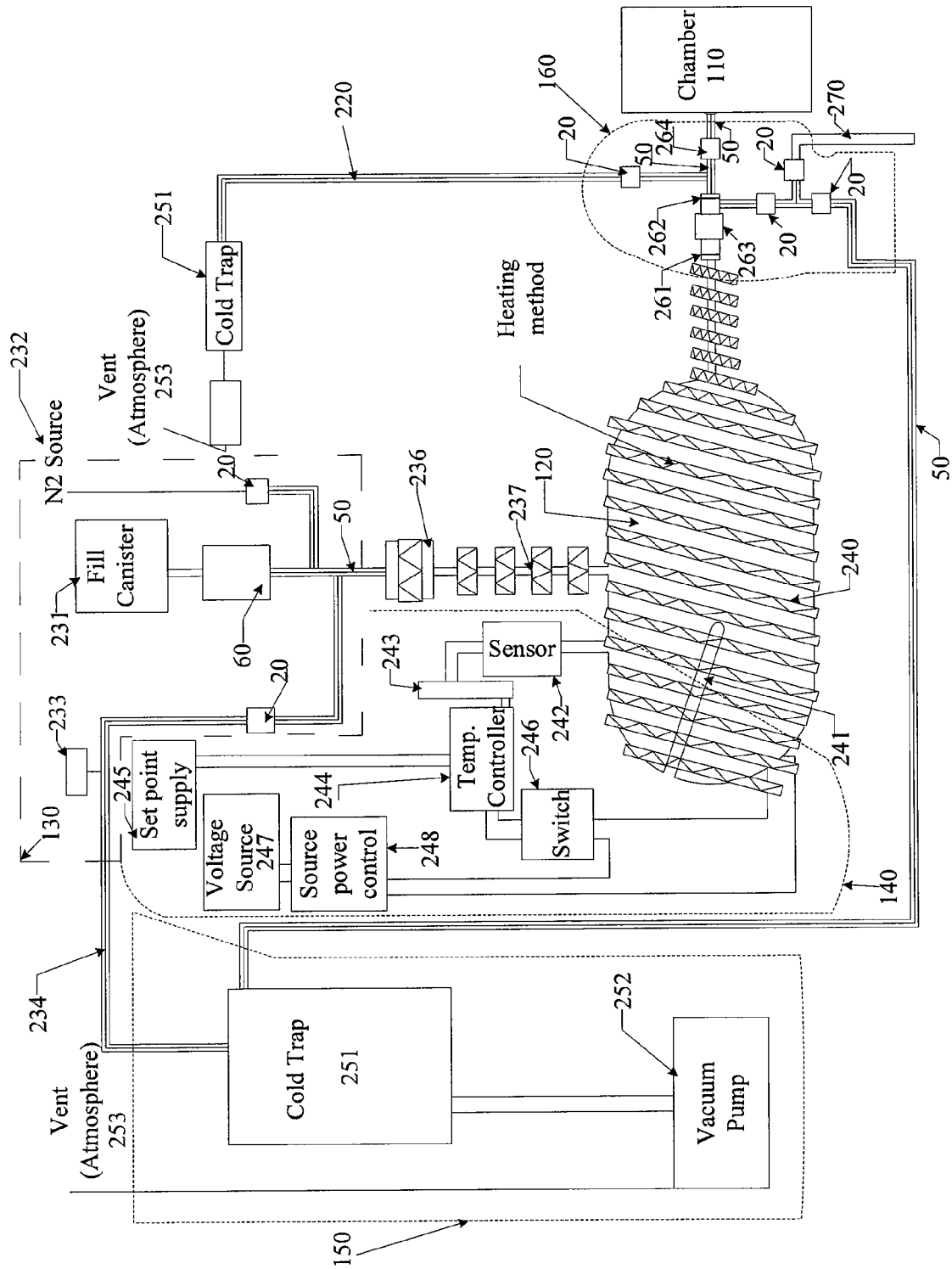
FIG. 2 illustrates an exemplary embodiment of an iodine delivery system.

In an exemplary embodiment and with momentary reference to FIG. 2, iodine fill source 130 comprises an iodine fill canister 231, a nitrogen source 232 (or inert gas source), and at least one valve 60. In accordance with an exemplary embodiment, iodine fill source 130 further comprises a fill valve 236 and a fill tube 237. In another exemplary embodiment, iodine fill source 130 further comprises a vacuum level sensor 233 in communication with a vacuum line 234 and another valve 20. In an exemplary embodiment, vacuum line 234, valve 20, and nitrogen source 232 are configured to facilitate purging of iodine vessel 120 of contaminants. This purging may occur prior and/or after filling iodine vessel 120 with iodine.

In an exemplary embodiment, iodine fill source 130 is configured to facilitate a reduction in contaminates (such as air). An exemplary method of contaminate reduction comprises the steps of vacuuming iodine fill canister 231, and back filling with nitrogen from nitrogen source 232 iodine fill canister 231.

The exhaust system 150 acts in conjunction with valve system 160 to facilitate removal of contaminants and maintain a controlled flow of pure iodine gas from iodine vessel 120 to process chamber 110. Exhaust system 150 is configured to reduce the amount of excess chemicals that escape into the atmosphere. In an exemplary embodiment, exhaust system 150 comprises at least one cold trap 251, a vacuum pump 252 and a vent 253. In accordance with the exemplary embodiment, iodine gas is condensed onto cold trap 251 and does not enter vacuum pump 252. The remaining iodine gas may be vented into the atmosphere at vent 253.

In accordance with an exemplary embodiment, control system 140 is configured to monitor and control the conditions of iodine delivery system 100. In an exemplary embodiment, control system 140 receives temperature data and/or pressure data from sensors associated with iodine vessel 120. Control system 140 uses the temperature and pressure data to determine whether the system conditions should be adjusted to achieve the desired temperature and pressure of the iodine gas in iodine vessel 120.

In an exemplary embodiment, control system 140 is configured to predictively adjust the operating conditions of iodine vessel 120. The predictive adjustments are based at least in part on anticipating the release of an iodine gas flow, and corresponding pressure drop, from iodine vessel 120. For example, in order to maintain the desired operating conditions in iodine vessel 120, the control system may increase the temperature prior to release of iodine gas. This temperature increase results in higher pressure in iodine vessel 120, which is in turn lowered as an iodine gas flow occurs. The operating conditions are predictively adjusted in anticipation of the iodine gas flow because an increase in iodine vessel pressure takes longer then a pressure drop corresponding to release of iodine gas. In other words, the vessel pressure drops faster when releasing iodine gas then the time it takes to increase pressure through heating. Maintaining a positive pressure in iodine vessel 120 in comparison to process chamber 110 allows an outflow of iodine gas without contamination of the iodine, which would be caused by back flow of air, or contaminants from process chamber 110, into iodine vessel 120.

In accordance with an exemplary embodiment, control system 140 comprises a microprocessor to gather and implement all the operating condition data of iodine delivery system 100. The microprocessor is able to calculate the operating conditions based on the desired conditions and upcoming events.

In an exemplary embodiment and with reference to FIG. 2, control system 140 comprises a temperature sensor 241, a pressure sensor 242, a signal conditioner 243, a temperature controller 244, a set point supply 245, a switch 246, a voltage source 247, and a variable source power control 248. In one embodiment, temperature sensor 241 is a thermocouple port or other known device suitable for sensing temperature.

In an exemplary embodiment and as mentioned above, electrical power is used to heat iodine vessel 120. The electrical power may be supplied by variable source power control 248. The power from source power control 248 passes through switch 246 to heating tape 240. Switch 246 may further be controlled based on pressure and/or temperature feedback, for example, switch 246 may receive a control signal from temperature controller 244. Temperature controller 244 may be configured to convert temperature data from temperature sensor 241 into a voltage signal. In another exemplary embodiment, iodine vessel 120 further comprises a port configured to allow a pressure sensor, such as a transducer, to connect and output a voltage based on a sensed pressure within iodine vessel 120. This voltage output may be transmitted through a line conditioner 243 and then to temperature controller 244.

In accordance with the exemplary embodiment, temperature controller 244 is able to control the temperature of iodine vessel 120 based at least in part on the pressure sensed in iodine vessel 120 (e.g., based at least in part on the output voltage of the pressure sensor). In an exemplary embodiment, temperature controller 244 may be configured to compare the output voltage to a set point stored in set point supply 245. The comparison between the output voltage and the set point relates to whether the pressure of the iodine gas is above or below the desired pressure.

In an exemplary embodiment, if the pressure is too low, then control system 140 transmits a signal that facilitates increasing the temperature of iodine vessel 120. In this way, the temperature and the pressure of the iodine gas is increased to the desired levels. Conversely, if the pressure of the iodine gas is too high, then control system 140 transmits a signal that facilitates providing less heat to iodine vessel 120. In this way, the temperature and pressure of the iodine gas decrease to the desired levels.

In an exemplary embodiment, control system 140 uses variable source power control 248 to supply electrical power and control the temperature control procedures. Variable source power control 248 receives a signal from temperature controller 244 to control the amount of power supplied. Furthermore, a switch 246 is in communication with variable source power control 248, temperature controller 244 and the heating source of iodine vessel 120. In one embodiment, switch 246 is a solid state relay, but other suitable switches may be used.

In an exemplary embodiment, the temperature control operation is initially based in part on data from temperature sensor 241, which is converted to a voltage input. Furthermore, a set point may be used in control system 140 because a set point is more exact than using just a thermocouple as a temperature sensor. Comparing the pressure sensor output voltage to a set point facilitates a more precise and cost effective method of heat control than using a basic thermocouple because an output voltage may comprise additional decimal places. For example, a thermocouple may only produce a reading to the tenth decimal place (e.g., 0.X), but an output voltage is capable of having a more decimal places (e.g., 0.XXX).

In an exemplary embodiment, implementing a signal conditioner 243 allows an increase in the sensitivity of the signal depending on the pressure range of operation, whereas a pressure transducer only provides a voltage range versus pressure range. For example, with an iodine gas pressure range of 1-5 PSIG, and a transducer capable of measuring a 0-10 PSIG range with a 0-10 voltage output range, it is possible to independently increase the voltage output signal with signal conditioner 243. In effect, this increases the sensitivity of pressure transducer 190 in the 1-5 PSIG range, and facilitates pressure control capabilities in the range of +/−0.006 PSIG.

In accordance with an exemplary embodiment and with reference to FIG. 2, valve system 160 comprises a pre-restrictor 261 connected to iodine vessel 120, a restrictor 262 configured to control the gaseous iodine flow, and a flow control valve 263 positioned between pre-restrictor 261 and restrictor 262. In an exemplary embodiment, restrictor 262 is a fixed orifice that is configured to provide a controlled gas flow when the pressure on both sides of restrictor 262 is known. Furthermore, in another exemplary embodiment, restrictor 262 is heated to substantially match the temperature of the iodine gas in iodine vessel 120. Heating restrictor 262 helps to reduce condensation of the iodine gas in valve system 160.

The gaseous iodine flow may be adjusted by varying the size of the fixed orifice or the pressure in iodine vessel 120. The size of the fixed orifice may be altered prior to operation of iodine delivery system 100, while the pressure in iodine vessel 120 is adjustable during operation. For example, if the pressure of the iodine gas is 2.5 PSIG in iodine vessel 120 and 0 PSIG on the other side, with a fixed orifice size of 13 microns, then the gas flow is 0.31 SCCM. The precise gaseous flow depends on the preciseness of the fixed orifice and the control of the pressure in iodine vessel 120. It should be understood that any suitable combination of operating pressure within iodine vessel 120 and fixed orifice size is contemplated herein.

Opening flow control valve 263 quickly may result in a pressure drop in iodine vessel 120. Pressure drops in turn may cause erratic pressure control. In an exemplary embodiment, pre-restrictor 261 is configured to help control the pressure drop in iodine vessel 120 if flow control valve 263 is opened. In the exemplary embodiment, temperature controller 244 supplies a slightly higher output voltage, and thus slightly increases the heat supplied to iodine vessel 120, in response to iodine gas being released through pre-restrictor 261 and restrictor 262. The higher pressure in iodine vessel 120, in combination with the space between pre-restrictor 261 and restrictor 262, facilitates a reduction of erratic pressure variances due to the controlled pressure release.

Furthermore, in an exemplary embodiment, the area between restrictor 262 and flow control valve 263 is configured to be vacuumed and purged by an inert gas, such as nitrogen. The nitrogen can be supplied by a nitrogen purge capability line 270. The vacuuming and purging of this area may assist in keeping restrictor 262 from becoming plugged, especially if restrictor 262 has a small-sized orifice.

In accordance with an exemplary embodiment, valve system 160 may further comprise a second flow control valve 264 between iodine vessel 120 and process chamber 110. In an exemplary embodiment, second flow control valve 264 is between restrictor 262 and process chamber 110. Second flow control valve 264 is configured to shutoff access to process chamber 110 if iodine gas is released from iodine chamber 120 and passed into one of the vent lines. In an exemplary embodiment, a flow of iodine gas is stabilized and/or adjusted prior to injection into process chamber 110.

Although other materials may be used, in an exemplary embodiment, valves 20 and vent lines 50 may be made of materials that are resistant to iodine corrosion, similar to iodine vessel 120. In the embodiment, a separate vent line 220 facilitates an established iodine gas flow prior to the iodine gas being transported in process chamber 110. As with the other valves and vent lines, in an exemplary embodiment, separate vent line 220 and second flow control valve 264 are heated to substantially the same temperature as the iodine gas to reduce iodine condensation. Another iodine cold trap 251 may be located at the end of separate vent line 220. These cold traps may be configured to prevent iodine gas from entering the atmosphere by condensing the iodine gas in the cold trap. The cold trap is kept at a low temperature, such as 0° C. The temperature of cold trap 251 varies depending on the exposure time of the iodine gas in cold trap 251. In an exemplary embodiment, the temperature of cold trap 251 is sufficient to return the iodine gas into a solid state. Additionally, cold traps may be removed for proper disposal or subjected to iodine reclamation methods.

In an exemplary embodiment, valve system 160 is configured to facilitate a controlled, sustained, constant and/or stable flow of iodine gas at a desired flow rate. In addition to the various embodiments of valve system 160 described herein, any combination of valves, restrictors, and vent lines that facilitate the controlled flow of iodine gas may be implemented. In addition, as previously discussed, the heating control of iodine vessel 120 may be based at least in part on the opening and closing of valves.

Figure 3:
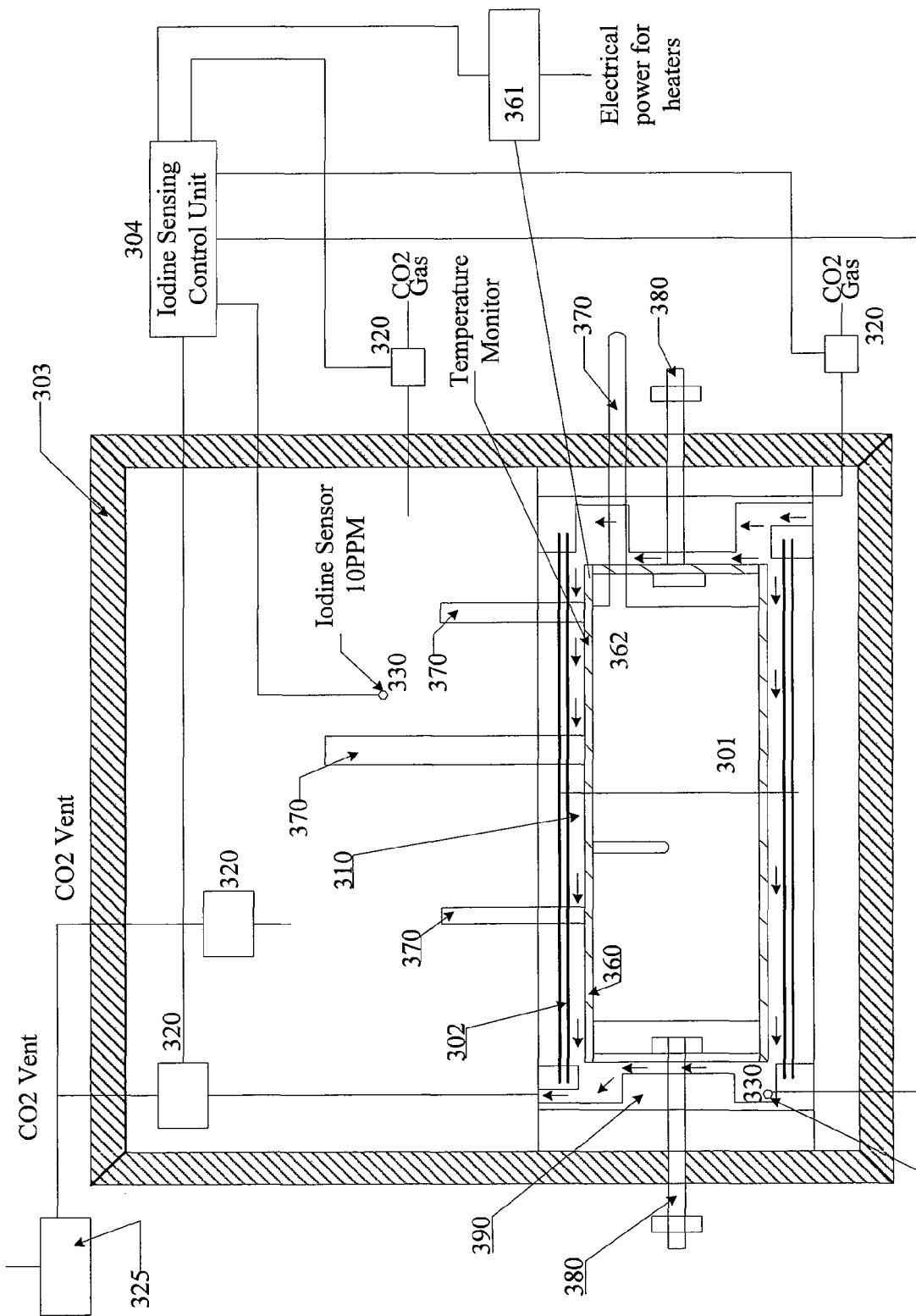
FIG. 3 illustrates another exemplary embodiment of an iodine delivery system.

In accordance with an exemplary embodiment and with reference to FIG. 3, an iodine delivery system 300 comprises a passageway cylinder 302 surrounding iodine vessel 301, an enclosure 303 surrounding both passageway cylinder 302 and iodine vessel 301, and a control system 304 configured to control iodine delivery system 300. In another exemplary embodiment, iodine vessel 301 comprises support tubes 380 in contact with end blocks 390 attached to enclosure 303. Support tubes 380 are configured to support iodine vessel 301 such that iodine vessel 120 is suspended within passageway cylinder 302.

Figure 4:
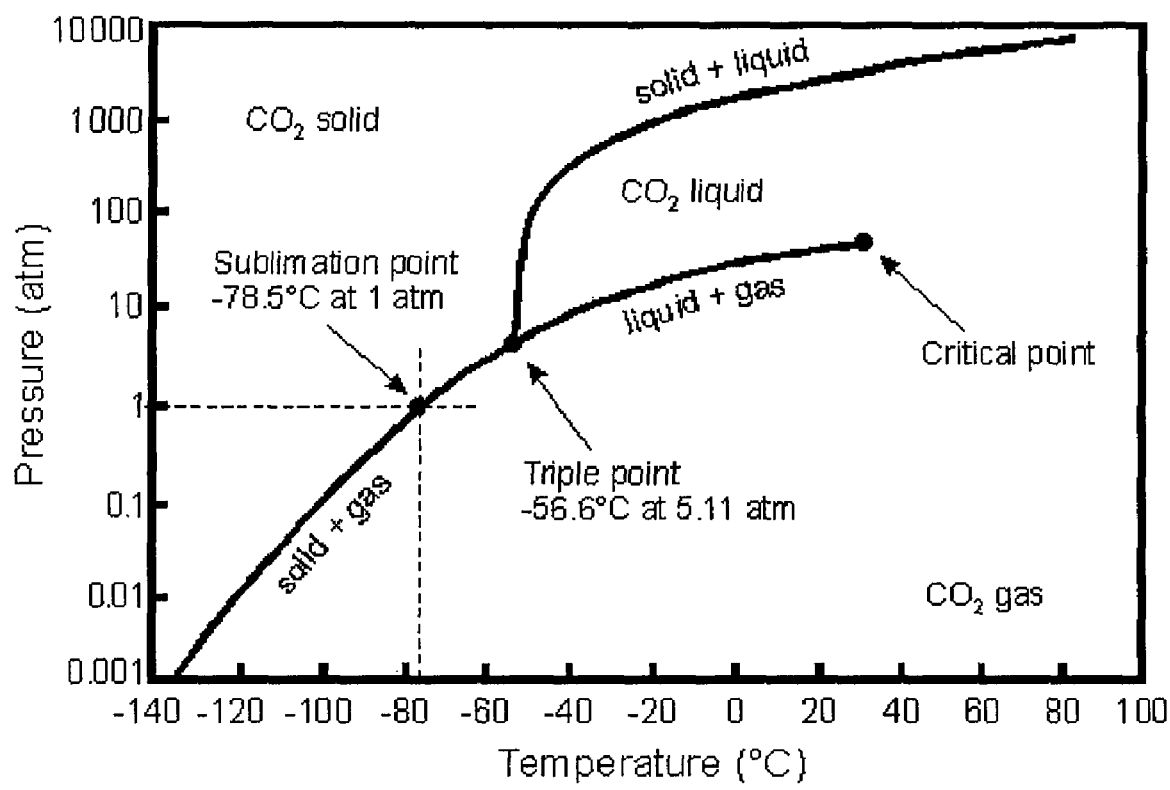
FIG. 4 illustrates a phase diagram of carbon dioxide.

In an exemplary embodiment, carbon dioxide (CO2) gas is used in iodine delivery system 300 to provide rapid cooling capability. The CO2 gas is pumped through a passageway 310 created between iodine vessel 301 and passageway cylinder 302 by suspending iodine vessel 301. The phase diagram of FIG. 4 illustrates the relationship with pressure and temperature of the physical state of CO2. Due to the cool temperature of CO2 gas, the surface of iodine vessel 301 can be quickly cooled in the event of an iodine leak. The heated iodine gas within iodine vessel 301 cools down and converts to an iodine solid, and stops a leak. In accordance with the present invention, a substantial amount of iodine may be converted to iodine gas depending on the volume of iodine vessel 301. A leak of iodine that is uncontained results in a large amount of corrosive and dangerous material flooding a manufacturing area. Thus, a cooling system capable of quickly forming the iodine into a solid state and containing potential leaks is beneficial.

In an exemplary embodiment, various methods and techniques may be used to achieve the desired cooling of the iodine gas. For example, liquid nitrogen could be pumped through iodine delivery system 300, or a water cooled system could be used. The specific description of a CO2 gas embodiment is not meant to be limiting.

With reference to FIG. 3, in another exemplary embodiment, iodine delivery system 300 further comprises shut-off valves 320 configured to control the flow of CO2 gas, and iodine gas sensors 330 to detect the presence of iodine gas in the system. In yet another exemplary embodiment, iodine delivery system 300 further comprises a heat source 360 around iodine vessel 301, an electrical power supply 361 associated with heat source 360, and a temperature monitor 362 to monitor the temperature of heat source 360. Heat source 360, electrical power supply 361 and temperature monitor 362 are similar to components as previously discussed with reference to FIG. 2. In yet another exemplary embodiment, iodine delivery system 300 further comprises tubes 370 which may be used in a variety of manners, such as providing a connection for iodine gas sensors 330, supplying iodine to iodine vessel 301, and delivering the iodine gas. Furthermore, vents may be placed throughout iodine delivery system 300 and a gas scrubber 325 may be used for the CO2 gas prior to release out of the system. Quartz material may be used throughout iodine delivery system 300, as quartz is more resistant to deterioration in an anhydrous iodine environment. For example, iodine vessel 301 and tubes 370 can be quartz.

The iodine delivery system 300 has safety features, such as cooling with CO2 gas, in case of an iodine leak. In an exemplary embodiment, iodine gas sensor 330 is configured to detect iodine gas in the 10 ppm range, though other ranges are suitable as would be known to one skilled in the art. In another exemplary embodiment, control system 304 receives a signal from iodine gas sensor 330 in response to detection of iodine gas. Then, control system 304 is configured to send a signal to open shutoff valves 320 and allow a high flow of CO2 gas through passageway 310. Control system 304 is also configured to send a signal to turn off heat source 360.

Figure 5:
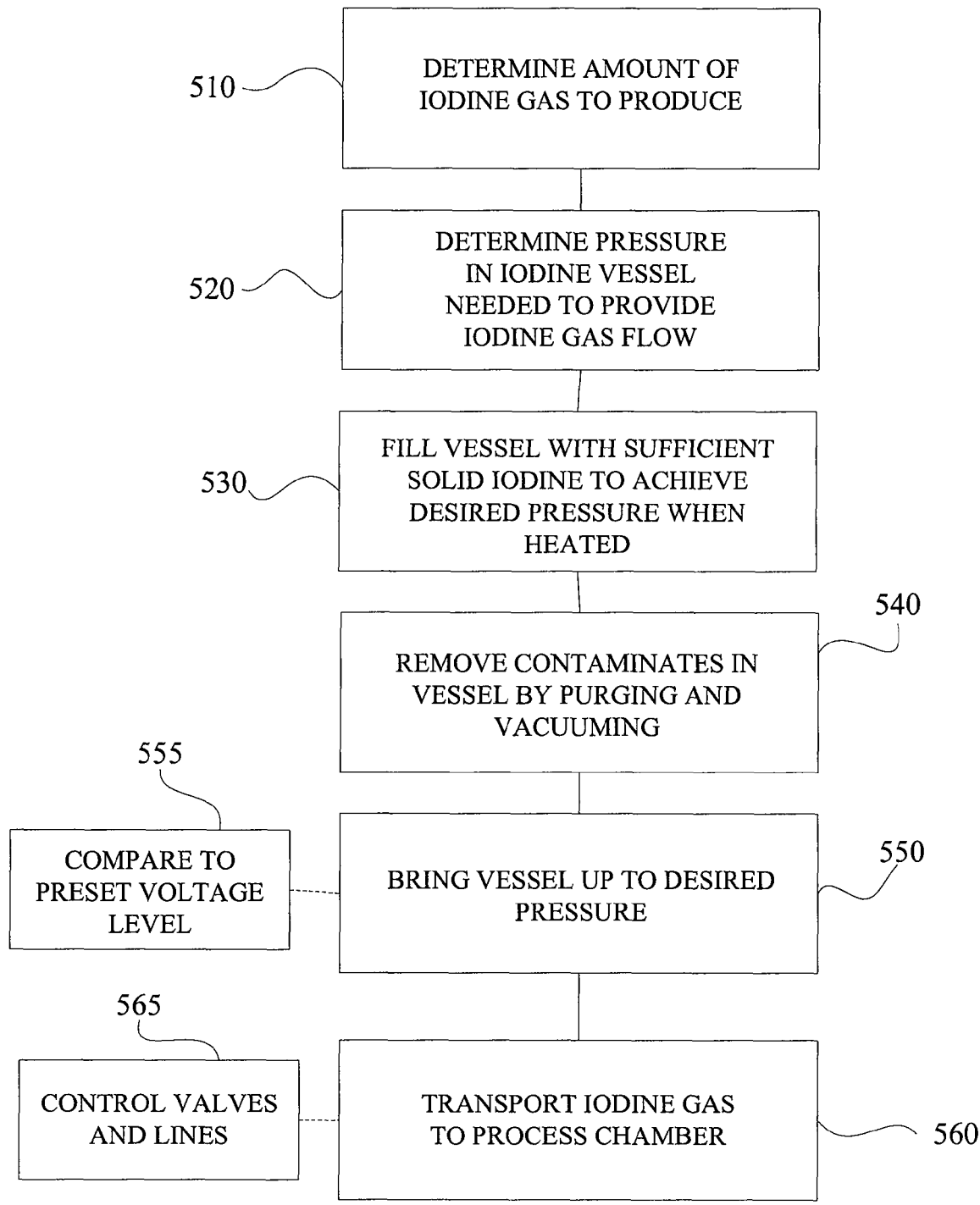
FIG. 5 illustrates a flow chart of an exemplary method of iodine gas production.

In accordance with an exemplary method of producing iodine gas, iodine is heated to cause it to sublime. The gaseous iodine is formed at a positive pressure depending on the amount of iodine and the volume of iodine vessel 120. In the exemplary method and with reference to FIG. 5, an initial step may be to determine the amount of iodine gas to produce for the intended process (Step 510). A positive pressure in iodine vessel 120 relative to the pressure of process chamber 100 is needed, so a determination is made of the pressure needed to provide an iodine gas flow (Step 520). The iodine vessel 120 is filled with enough solid iodine to achieve the desired pressure if sufficiently heated (Step 530). Furthermore, removal of contaminants from iodine vessel 120 is achieved by purging and vacuuming the vessel (Step 540). The iodine vessel 120 is brought up to the desired pressure through heating and pressure is controlled by a voltage signal (Step 550). In one embodiment, the voltage signal is compared to a preset voltage signal (Step 555). Once the desired pressure is reached, iodine gas is transported to process chamber 110 through various valves and lines (Step 560). The valves and lines may be controlled (Step 565) by control system 140.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. An iodine delivery system comprising:
   an iodine vessel configured to receive solid iodine supplied by an iodine fill source, wherein the iodine vessel is heated to produce iodine gas; and
   a valve system configured to control the flow of iodine gas through the iodine delivery system and into a process chamber, wherein the iodine gas is transported without the aid of a carrier gas;
   a control system configured to monitor and control the operating conditions in the iodine vessel and maintain a positive pressure in the iodine vessel relative to the process chamber;
   a passageway cylinder surrounding the iodine vessel, and wherein the iodine vessel is suspended away from the passageway cylinder; and
   an iodine sensor configured to detect the presence of an iodine leak within the area between the passageway cylinder and the iodine vessel;
   wherein a coolant, in response to detection of an iodine leak, is passed into the area between the passageway cylinder and the iodine vessel to facilitate cooling of the iodine into a solid state and stopping the iodine leak.

2. The iodine delivery system of claim 1, wherein the iodine delivery system is configured to provide a controlled flow of iodine gas.

3. The iodine delivery system of claim 2, wherein the controlled flow of iodine gas is at least one of a sustained flow, a constant flow, or a stable flow.

4. The iodine delivery system of claim 1, wherein the operating conditions in the iodine vessel are predictively adjusted in anticipation of the effect of the controlled flow of iodine gas.

5. The iodine delivery system of claim 1, wherein the operating conditions in the iodine vessel comprise at least one of a pressure inside the iodine vessel and a temperature inside the iodine vessel.

6. The iodine delivery system of claim 1, wherein the iodine vessel is maintained at a controlled temperature and wherein the controlled temperature is determined based at least in part on the flow of the iodine gas.

7. The iodine delivery system of claim 1, wherein the temperature of the iodine vessel is increased in response to the flow of iodine gas so that the pressure inside the iodine vessel is maintained at a suitable level.

8. The iodine delivery system of claim 1, wherein the iodine vessel comprises quartz material.

9. The iodine delivery system of claim 1, wherein the pressure range of the iodine vessel is 0-25 PSIG; and wherein the iodine vessel is heated to a range of 100° C. to 300° C.

10. The iodine delivery system of claim 1, further comprising an enclosure containing the iodine vessel and the passageway cylinder.

11. The iodine delivery system of claim 1, further comprising an exhaust system configured to facilitate the removal of at least one of the iodine gas and contaminants from the iodine delivery system.

12. The iodine delivery system of claim 11, wherein the exhaust system comprises at least one cold trap, at least one vacuum pump, and at least one vent, and wherein the exhaust system is configured to reduce the amount of excess chemicals that escape into the atmosphere.

13. The iodine delivery system of claim 1, wherein the valve system comprises a separate vent line configured to facilitate the stabilization of the iodine gas flow prior to injecting iodine gas into the process chamber.

14. The iodine delivery system of claim 1, wherein the valve system comprises a pre-restrictor, a restrictor, and a flow control valve in between the pre-restrictor and the restrictor; and wherein the restrictor, the pre-restrictor, and the flow control valve are heated to substantially match the iodine gas temperature.

15. An iodine gas delivery method comprising:
   determining, by a control system, a desired operating pressure of an iodine vessel to provide a flow of the iodine gas to a process chamber from the iodine vessel, wherein the iodine vessel is constantly maintained at a positive pressure relative to the process chamber;
   filling the iodine vessel with sufficient iodine to achieve the desired operating pressure in response to heating the iodine vessel;
   removing contaminates in the iodine vessel by purging and vacuuming;
   heating the iodine vessel to achieve the desired operating pressure in the iodine vessel; and
   transporting the iodine gas from the iodine vessel to the process chamber, wherein the iodine gas is transported without the aid of a carrier gas;
   wherein the control system predictively adjusts the operating conditions of the iodine vessel based at least in part on anticipating pressure effects associated with the transporting the iodine gas from the iodine vessel.

16. The iodine gas delivery method of claim 15, further comprising:
   comparing a voltage signal representative of the temperature in the iodine vessel with a preset voltage level, wherein the voltage signal is used to control the heating the iodine vessel; and
   controlling at least one valve to enable the transporting the iodine gas through a line.

17. The iodine gas delivery method of claim 15, further comprising:
   controlling the flow rate of the iodine gas by adjusting the pressure of the iodine vessel; and
   providing a controlled flow of the iodine gas, wherein the controlled flow is regulated based on at least one of a temperature and a pressure inside the iodine vessel.

18. A method of stopping an iodine gas leak, the method comprising:
   receiving, at a control system, a signal from an iodine gas sensor in response to detection of iodine gas that has leaked from an iodine vessel into a passageway between the iodine vessel and a passageway cylinder surrounding the iodine vessel;
   sending, by the control system, a signal to open a least one shutoff valve, wherein the at least one shutoff valve is configured to allow a high flow of coolant into the passageway between the passageway cylinder and the iodine vessel;
   pumping the coolant into the passageway, wherein the surface of the iodine vessel and iodine leaking from the iodine vessel are quickly cooled by the coolant; and
   converting the iodine gas to an iodine solid for containing the iodine gas leak.

19. The method of claim 18, wherein the coolant is at least one of carbon dioxide gas, liquid nitrogen, or water.

20. The method of claim 18, wherein the iodine gas sensor is configured to detect the presence of iodine gas in the 10 ppm range.

21. The method of claim 18, further comprising sending, by the control system, a signal to turn off a heat source of the iodine vessel.

22. The method of claim 21, further comprising monitoring, by a temperature monitor, the temperature of the heat source.

23. The method of claim 18, wherein the containing the iodine gas leak comprises sealing the iodine gas leak with the iodine solid itself.

* * * * *